(12) United States Patent
Cheng (10) Patent No.: US 10,916,445 B2
(45) Date of Patent: Feb. 9, 2021

(54) METHOD FOR PREPARING A P-TYPE SEMICONDUCTOR LAYER, ENHANCED DEVICE AND METHOD FOR MANUFACTURING THE SAME

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 0 days.

(21) Appl. No.: 16/441,586

(22) Filed: Jun. 14, 2019

(65) Prior Publication Data

US 2019/0311914 A1 Oct. 10, 2019

Related U.S. Application Data

(63) Continuation of application No. PCT/CN2017/099145, filed on Aug. 25, 2017.

(51) Int. Cl.
*H01L 29/66* (2006.01)
*H01L 21/02* (2006.01)
(Continued)

(52) U.S. Cl.
CPC .... *H01L 21/3245* (2013.01); *H01L 21/02458* (2013.01); *H01L 29/207* (2013.01);
(Continued)

(58) Field of Classification Search
CPC ......... H01L 21/02104; H01L 21/02365; H01L 21/02436; H01L 21/02458;
(Continued)

(56) References Cited

U.S. PATENT DOCUMENTS

2014/0091364 A1* 4/2014 Imanishi .......... H01L 29/66431
257/194
2014/0264451 A1* 9/2014 Ozaki ................ H01L 29/7786
257/194

(Continued)

FOREIGN PATENT DOCUMENTS

CN 101663759 A 3/2010
CN 102683394 A 9/2012
CN 105720097 A 6/2016

OTHER PUBLICATIONS

Written Opinion of the International Searching Authority, PCT/CN2017/099145, dated May 25, 2018, Enkris Semiconductor Inc.

(Continued)

*Primary Examiner* — Cheung Lee
(74) *Attorney, Agent, or Firm* — Flener IP & Business Law; Zareefa B. Flener (57) ABSTRACT

A method for preparing a p-type semiconductor layer, an enhanced device and a method for manufacturing the same disclosed relate to the technical field of microelectronics. The method for preparing a p-type semiconductor layer includes: preparing a p-type semiconductor layer; preparing a protective layer on the p-type semiconductor layer, in which the protective layer is made of AlN or AlGaN; and annealing the p-type semiconductor layer under protection of the protective layer. In this way, the protective layer can protect the p-type semiconductor layer from volatilization and to form high-quality surface morphology in the subsequent high-temperature annealing treatment of the p-type semiconductor layer.

7 Claims, 7 Drawing Sheets

(51) Int. Cl.
  *H01L 21/324* (2006.01)
  *H01L 29/207* (2006.01)
  *H01L 29/778* (2006.01)

(52) U.S. Cl.
  CPC ...... *H01L 29/66462* (2013.01); *H01L 29/778* (2013.01); *H01L 29/66431* (2013.01); *H01L 29/7783* (2013.01)

(58) Field of Classification Search
  CPC .......... H01L 21/02518; H01L 21/0254; H01L 21/02573; H01L 21/324; H01L 21/3245; H01L 29/02; H01L 29/1066; H01L 29/12; H01L 29/2003; H01L 29/207; H01L 29/66; H01L 29/66431; H01L 29/66446; H01L 29/66462; H01L 29/778; H01L 29/7782; H01L 29/7783; H01L 29/7786
  See application file for complete search history.

(56) References Cited

U.S. PATENT DOCUMENTS

2014/0264454 A1  9/2014  Banerjee et al.
2018/0286945 A1* 10/2018  Oka ................... H01L 29/2003
2018/0315844 A1* 11/2018  Chen .................. H01L 29/7783

OTHER PUBLICATIONS

International Search Report, PCT/CN2017/099145, dated May 25, 2018.

* cited by examiner

METHOD FOR PREPARING A P-TYPE SEMICONDUCTOR LAYER, ENHANCED DEVICE AND METHOD FOR MANUFACTURING THE SAME

CROSS-REFERENCE TO ASSOCIATED APPLICATIONS

This application is a continuation application of International Application No. PCT/CN2017/099145, filed on Aug. 25, 2017. All of the aforementioned applications are hereby incorporated by reference in their entireties.

TECHNICAL FIELD

The present invention relates to the technical field of microelectronics, and in particular to a method for preparing a p-type semiconductor layer, an enhanced device and a method for manufacturing the same.

BACKGROUND

Figure 1:
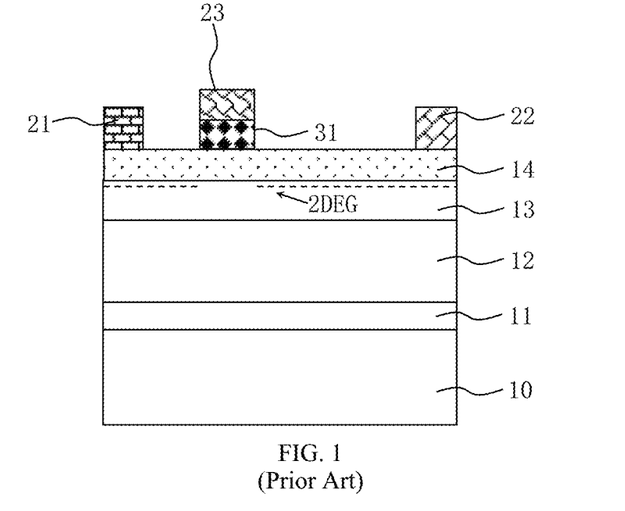
FIG. 1 is a schematic diagram of an embodiment of an enhanced device in the prior art.

In the prior art, a high electron mobility transistor (HEMT) can be provided with a p-type semiconductor layer at a gate to deplete two-dimensional electron gas of a gate region, so that the HEMT may be used to manufacture an enhanced device, as shown in FIG. 1. FIG. 1 illustrates an example of the enhanced device, in which the enhanced device includes a substrate 10, a nucleation layer 11, a buffer layer 12, a channel layer 13, a barrier layer 14, a p-type semiconductor layer 31, a source 21, a drain 22 and a gate 23, and the two-dimensional electron gas (2DEG) under the gate 23 is depleted by the p-type semiconductor layer 31.

For such enhanced devices, the quality of the p-type semiconductor layer is the most critical link, in which a sufficiently high hole concentration is required to deplete the two-dimensional electron gas (2DEG) in the gate region, and a sufficiently high threshold voltage is ensured to avoid accidental opening of the device. Furthermore, a gate voltage needs to have a sufficiently high swing to achieve high-speed switching of the device.

In the process of implementing the present invention, the inventors find that at least the following problems exist in the prior art.

It is relatively difficult to prepare high-quality wide-bandgap p-type semiconductor layers. First, an energy level is so deep that it is difficult to ionize, and other impurities are incorporated during growth process so that the p-type cannot be formed. Therefore, secondary annealing is required, but the annealing process usually causes damage to surface morphology of the p-type semiconductor layer. Taking GaN material as an example, when p-type GaN material is achieved by doping GaN with Mg, the doping of Mg has a memory effect, and there are difficulties in control of Mg concentration. After the p-type GaN material is grown, since an H atom has a passivation effect on Mg, Mg-H bonds are formed, and holes cannot be grown. Therefore, the annealing needs to be performed in an atmosphere without hydrogen and at a temperature above 700° C. to break the Mg-H bonds and activate Mg atoms in the p-type GaN material. However, in the high-temperature annealing process, a surface of the p-type GaN is damaged, and deterioration of the surface morphology may lead to a plurality of defects, thereby causing electric leakage and pre-breakdown of the device, and having a reliability problem.

SUMMARY

The purposes of the present invention are to provide a method for preparing a p-type semiconductor layer, an enhanced device and a method for manufacturing the same, which can improve morphological quality of the p-type semiconductor layer and performance of the enhanced device.

An embodiment of the present invention discloses a method for preparing a p-type semiconductor layer, including the following steps: preparing a p-type semiconductor layer; preparing a protective layer on the p-type semiconductor layer, in which the protective layer is made of AlN or AlGaN; and annealing the p-type semiconductor layer under protection of the protective layer.

Preferably, the p-type semiconductor layer includes anyone or any combination of p-type GaN, p-type InGaN and p-type AlInGaN.

Preferably, the p-type semiconductor layer is doped with Mg.

Preferably, preparation temperature of the protective layer is not higher than preparation temperature of the p-type semiconductor layer.

An embodiment of the invention also discloses an enhanced device, including: a substrate; a channel layer disposed on the substrate; a barrier layer disposed on the channel layer; a p-type semiconductor layer disposed on the channel layer; and a protective layer disposed on the p-type semiconductor layer, and the protective layer is made of AlN or AlGaN.

Preferably, the p-type semiconductor layer includes anyone or any combination of p-type GaN, p-type InGaN and p-type AlInGaN.

Preferably, the p-type semiconductor layer is doped with Mg.

Preferably, the enhanced device further includes: a thin film layer disposed between the barrier layer and the p-type semiconductor layer, and the thin film layer is an insulating layer or an n-type semiconductor layer.

An embodiment of the invention also discloses a method for manufacturing an enhanced device, including the following steps: forming a channel layer on a substrate; forming a barrier layer on the channel layer; forming a p-type semiconductor layer on the barrier layer; forming a protective layer on the p-type semiconductor layer, in which the protective layer is made of AlN or AlGaN; and annealing the p-type semiconductor layer under protection of the protective layer.

Preferably, the p-type semiconductor layer includes anyone or any combination of p-type GaN, p-type InGaN and p-type AlInGaN.

Preferably, the p-type semiconductor layer is doped with Mg.

Preferably, preparation temperature of the protective layer is not higher than preparation temperature of the p-type semiconductor layer.

Preferably, before the forming a p-type semiconductor layer on the barrier layer, a thin film layer is formed on the barrier layer, and the thin film layer is an insulating layer or an n-type semiconductor layer.

The enhanced device and the method for manufacturing the same disclosed in the above embodiments of the present invention have beneficial effects that compared with a traditional enhanced device, the protective layer 32 is provided to protect the p-type semiconductor layer 31 from damage caused by annealing process and to improve the quality of surface morphology of the p-type semiconductor layer, thereby improving electric leakage and pre-breakdown of the device, and increasing reliability of the device. The protective layer retained in the device also plays a role in reducing electric leakage of the gate and increasing the device swing. When the thin film layer 15 is an n-type semiconductor layer, etching the p-type semiconductor layer can be avoided, thereby simplifying the process flow greatly, and avoiding the effect of damage caused by etching on performance of the device.

BRIEF DESCRIPTION OF DRAWINGS

In order to more clearly illustrate the technical schemes of the embodiments of the present invention, the accompanying drawings used in the embodiments will be briefly introduced below. It should be understood that the following accompanying drawings only show certain embodiments of the present invention, and therefore the following accompanying drawings should not be regarded as a limitation on the scope. For those skilled in the art, other related accompanying drawings may also be obtained from these accompanying drawings without any creative effort.

DETAILED DESCRIPTION

In order to make purposes, technical schemes and advantages of the embodiments of the present invention clearer, the technical schemes in the embodiments of the present invention are clearly and completely described in the following with reference to the accompanying drawings in the embodiments of the present invention. Obviously, the embodiments which are described are a part of the embodiments of the present invention, and not all of the embodiments. Usually, components of the embodiments of the present invention described and illustrated in the accompanying drawings herein may be arranged and designed in a variety of configurations.

Therefore, the following detailed description of the embodiments of the present invention provided in the accompanying drawings is not intended to limit the scope of the present invention which is required to protect, but merely intended to represent selected embodiments of the present invention. Based on the embodiments of the present invention, all other embodiments acquired by those skilled in the art without creative effort fall within the scope of protection of the present invention.

In the description of the present invention, it should be understood that an orientation or positional relationship indicated by the terms of upper, lower, left, right and so on is based on the orientation or the positional relationship shown in the accompanying drawings, the orientation or the positional relationship in which the inventive product is conventionally placed in use, or the orientation or the positional relationship that is conventionally understood by those skilled in the art, is merely for the purpose of describing the present invention conveniently and simplifying the description, is not intended to indicate or imply that the device or component which is referred to must have a specific orientation and be constructed and operated in a specific orientation, and therefore cannot be understood as a limitation of the present invention.

Figure 2:
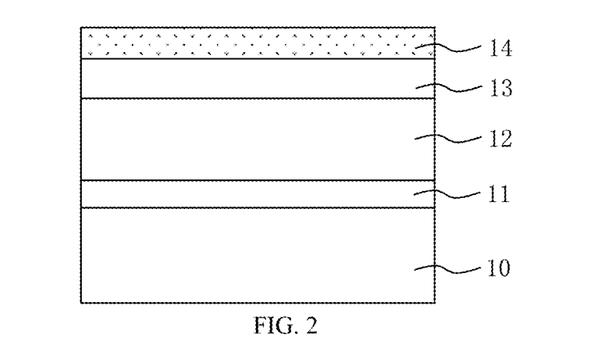
FIG. 2 to FIG. 6 are schematic diagrams of manufacture process of an enhanced device in an embodiment of the present invention.

Referring to FIG. 2 to FIG. 6, FIG. 2 to FIG. 6 are schematic diagrams of manufacture process of an enhanced device in an embodiment of the present invention Step 1: referring to FIG. 2, a nucleation layer 11, a buffer layer 12, a channel layer 13 and a barrier layer 14 are sequentially grown on a substrate 10.

The substrate 10 is one or more materials preferably selected from sapphire, silicon carbide, silicon, lithium niobate, silicon-on-insulator (SOI), gallium nitride, or aluminum nitride. Materials of the nucleation layer 11, the buffer layer 12, the channel layer 13, and the barrier layer 14 may be any one of group III-V compounds, or any combination of group III-V nitrides.

The nucleation layer 11 and the buffer layer 12 may be determined according to a design requirement, for example, provided for improving the quality of a semiconductor layer grown above the substrate 10. Taking growing GaN above a silicon substrate as an example, a nucleation layer and a buffer layer are generally disposed to improve the subsequent growth quality of the GaN. The nucleation layer 11 may be, for example, AlN, the buffer layer 12 may be, for example, AlGaN, GaN, InGaN or the like, the channel layer 13 may be, for example, GaN, and the barrier layer 14 may be, for example, AlGaN. However, the present invention is not limited to this, and the nucleation layer 11 and the buffer layer 12 are determined according to the materials of the substrate 10 and the channel layer 13. For example, GaN is grown above a gallium nitride substrate, the nucleation layer 11 and the buffer layer 12 may be omitted, or only one of the nucleation layer 11 and the buffer layer 12 may be disposed.

Figure 3:
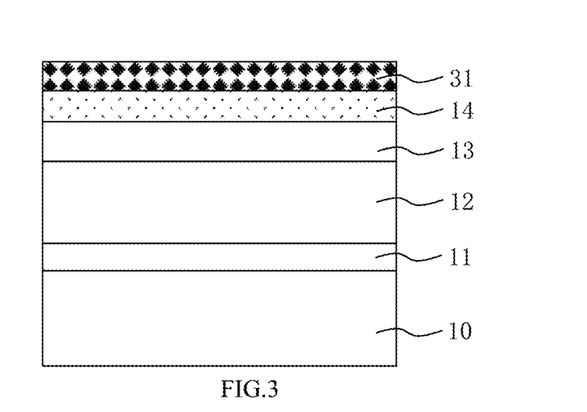

Step 2: referring to FIG. 3, a p-type semiconductor layer 31 is prepared on the channel layer 13.

Material of the p-type semiconductor layer 31 may be one or more selected from p-type GaN, p-type InGaN and p-type AlInGaN. The p-type semiconductor layer 31 is preferably doped with Mg.

Figure 4:
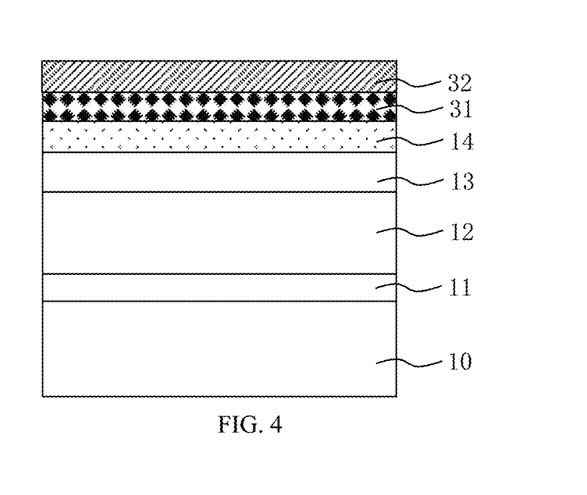

Step 3: referring to FIG. 4, a protective layer 32 is prepared on the p-type semiconductor layer 31, the protective layer 32 is AlN or AlGaN, and then the p-type semiconductor layer 31 is annealed.

In the above steps, the manufacture device may preferably be a Metal-organic Chemical Vapor Deposition (MOCVD) device, and may also be, for example, a Molecular Beam Epitaxy (MBE) device, an Atomic Layer Deposition (ALD) device or the like. Specific growth conditions may be determined according to a type of the material.

Preferably, preparation temperature of the protective layer 32 is not higher than growth temperature of the p-type semiconductor layer 31, so that the growth quality of the p-type GaN can be further improved.

In the present invention, the p-type semiconductor layer 31 preferably being p-type GaN doped with Mg is taken as an example, and the protective layer 32 may preferably be AlN or AlGaN. After the protective layer 32 is prepared, the p-type semiconductor layer is annealed. When the type semiconductor 31 is p-type GaN doped with the Mg preferably, annealing may be performed in an atmosphere without hydrogen and at a temperature above 700° C. The p-type semiconductor layer prepared by the present invention has relatively good surface morphology.

Figure 5:
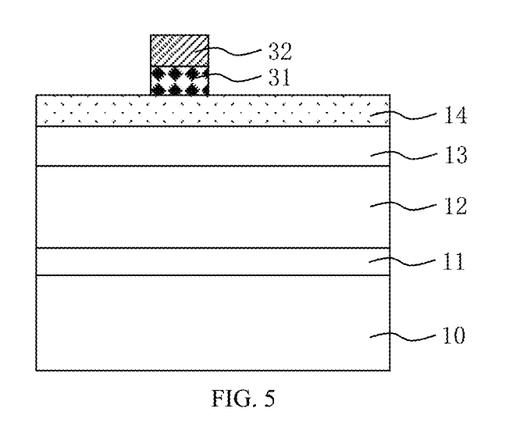

Step 4: referring to FIG. 5, the p-type semiconductor layer 31 and the protective layer 32 which are outside a gate region are etched.

Figure 6:
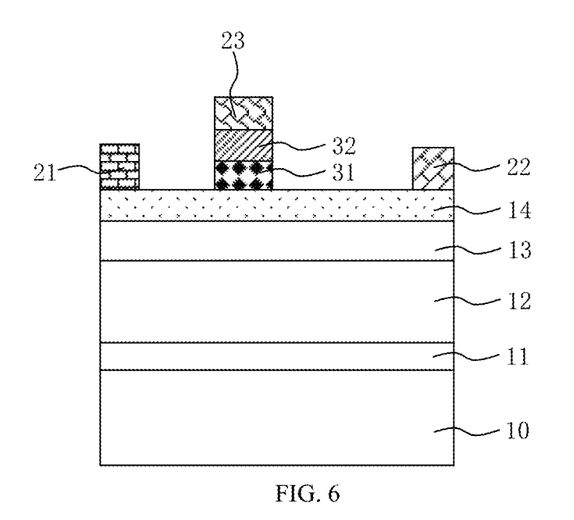

Step 5: referring to FIG. 6, a source 21, a drain 22, and a gate 23 are respectively prepared. Material of an electrode may be, for example, nickel, a nickel alloy, a metal oxide, a semiconductor or the like.

Figure 12:
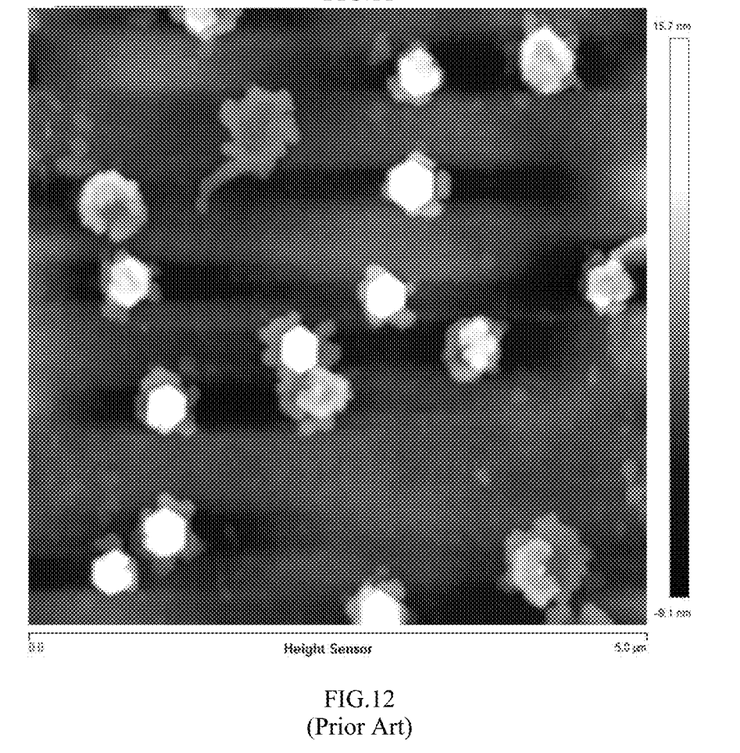
FIG. 12 is a surface morphology image of an annealed p-type semiconductor layer in the prior art under an atomic force microscope.
Figure 13:
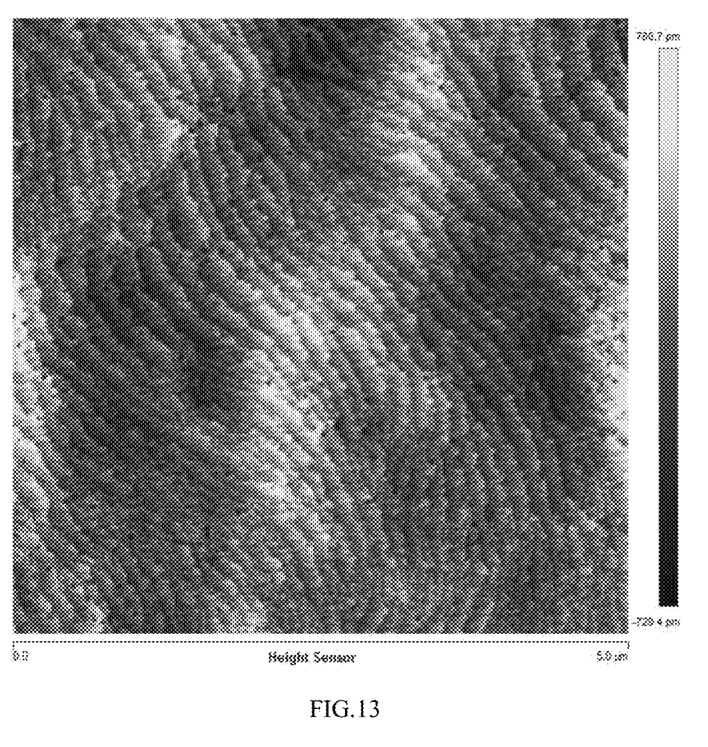
FIG. 13 is a surface morphology image of an annealed p-type semiconductor layer in the present invention under an atomic force microscope.

Referring to FIGS. 12 and 13, FIG. 12 is a surface morphology image of an annealed p-type semiconductor layer in the prior art under an atomic force microscope, in which roughness of the surface morphology of the p-type semiconductor layer is about 4 nm. FIG. 13 is a surface morphology image of an annealed p-type semiconductor layer in the present invention under an atomic force microscope, in which roughness of the surface morphology of the p-type semiconductor layer is less than 0.5 nm. The surface morphology of the p-type semiconductor layer is greatly improved by the present invention.

The above embodiments of the present invention have beneficial effects that the protective layer 32 better protects the p-type semiconductor layer 31 from damage caused by annealing process, and improves the quality of the surface morphology of the p-type semiconductor layer, thereby improving electric leakage and pre-breakdown of the device, and increasing reliability of the device. The protective layer retained in the device also plays a role in reducing electric leakage of the gate and increasing the device swing.

Those skilled in the art should understand that the above steps may be adjusted to some extent according to the design of the enhanced device.

FIG. 7 to FIG. 10 are schematic diagrams of manufacture process of an enhanced device in another embodiment of the present invention.

Figure 7:
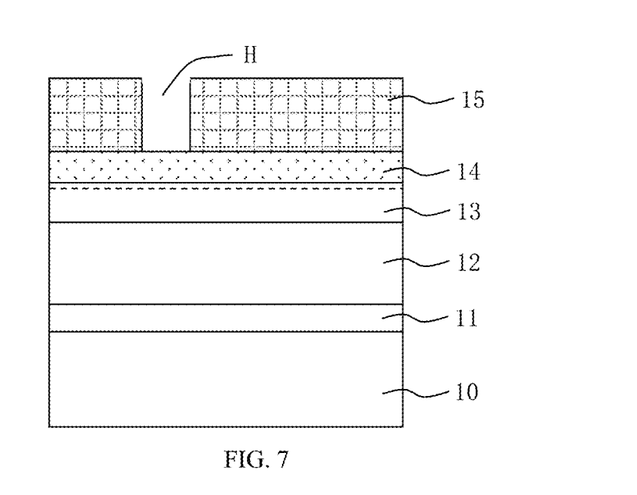
FIG. 7 to FIG. 10 are schematic diagrams of manufacture process of an enhanced device in an embodiment of the present invention.

Step 1: referring to FIG. 7, a nucleation layer 11, a buffer layer 12, a channel layer 13, a barrier layer 14 and a thin film layer 15 are sequentially grown on a substrate 10. Then a groove H is etched in a gate region of the thin film layer 15. The groove H may preferably penetrate through the thin film layer 15. The groove H penetrating through the film layer 15 may make the device have the best working effect. However, if not penetrating through and only partially etched, the enhanced device can also be realized.

The thin film layer 15 may be an insulating dielectric layer, which includes anyone or any combination of silicon nitride ($Si_3N_4$), silicon dioxide ($SiO_2$), aluminum nitride (AlN), aluminum nitride silicon ($SiAlN_x$), aluminum oxide ($Al_2O_3$), aluminum oxynitride (AlNO), hafnium oxide ($HfO_2$), silicon oxynitride ($Si_xO_yN_z$), and aluminum hafnium oxide (AlHfO).

Figure 8:
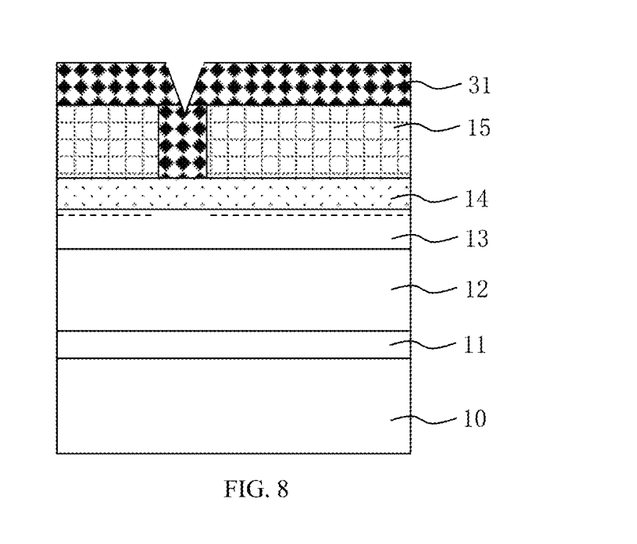

Step 2: referring to FIG. 8, a p-type semiconductor layer 31 is prepared on the thin film layer 15.

Figure 9:
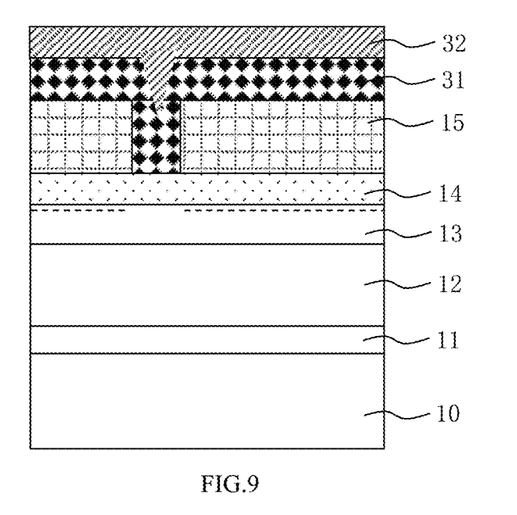

Step 3: referring to FIG. 9, a protective layer 32 is prepared on the p-type semiconductor layer 31. The protective layer 32 is made of AlN or AlGaN, and the protective layer 32 and the p-type semiconductor layer 31 may be prepared in a same device.

Preferably, preparation temperature of the protective layer 32 is not higher than growth temperature of the p-type semiconductor layer 31, so that the growth quality of the p-type GaN may be further improved.

Figure 10:
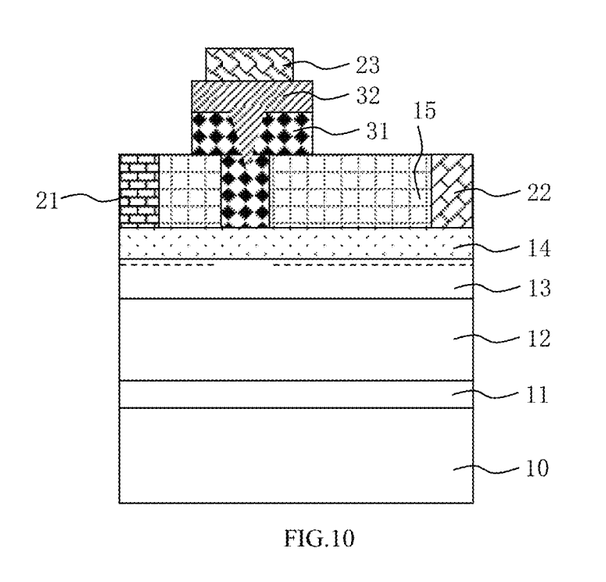

Step 4: referring to FIG. 10, the complete device structure is further manufactured according to a design requirement, and the p-type semiconductor layer 31 and the protective layer 32 which are outside the gate region may be removed.

Step 5: continuing to refer to FIG. 10, a source 21 and a drain 22 are respectively prepared on a source region and a drain region, and a gate 23 is prepared on the protective layer 32. The protective layer 32 may be further retained in the device structure to reduce electric leakage of the gate and increase the enhanced device swing.

The above embodiments of the present invention have beneficial effects that the protective layer 32 is provided to protect the p-type semiconductor layer 31 from damage caused by annealing process and to improve the quality of the surface morphology of the p-type semiconductor layer, thereby improving electric leakage and pre-breakdown of the device, and increasing reliability of the device. The protective layer retained in the device also plays a role in reducing electric leakage of the gate and increasing the device swing.

Those skilled in the art should understand that the above steps may be adjusted to some extent according to the design of the enhanced device.

Figure 11:
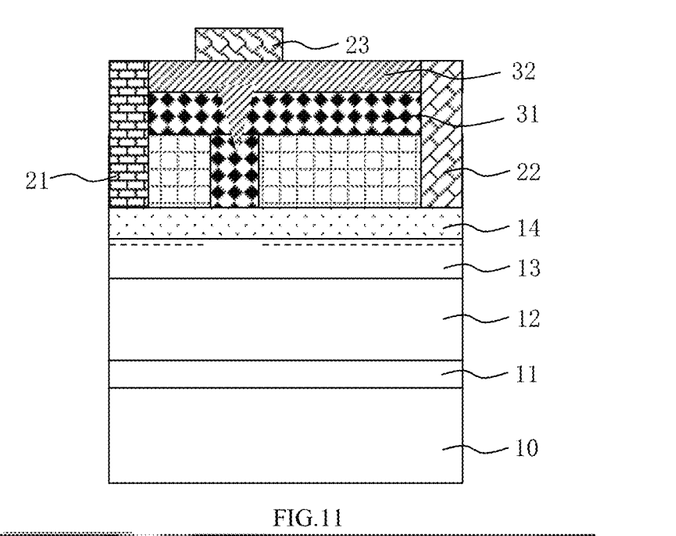
FIG. 11 is a schematic diagram of an enhanced device in another embodiment of the present invention.

In still another embodiment of the present invention, the thin film layer 15 in FIG. 7 to FIG. 10 may be an n-type semiconductor layer. Since the n-type semiconductor layer may perform electronic compensation on the channel layer, the source region and the drain region cannot be affected. The p-type semiconductor layer 31 and the protective layer 32 which are outside the gate region need not be etched first in step 4. The complete device structure is shown in FIG. 11. Selective etching of the p-type semiconductor layer is relatively difficult to control, and the etching is liable to cause damage to the device, however this embodiment can solve this problem properly.

The above embodiments of the present invention have beneficial effects that the protective layer 32 is provided to protect the p-type semiconductor layer 31 from damage caused by annealing process and to improve the quality of the surface morphology of the p-type semiconductor layer, thereby improving electric leakage and pre-breakdown of the device, and increasing reliability of the device. The protective layer retained in the device also plays a role in reducing electric leakage of the gate and increasing the device swing. When the thin film layer 15 is an n-type semiconductor layer, etching the p-type semiconductor layer can be avoided, thereby simplifying the process flow greatly, and avoiding the effect of damage caused by etching on performance of the device.

The above are only the preferred embodiments of the present invention, and are not intended to limit the present invention. For those skilled in the art, various modifications and changes may be made in the present invention. Any modifications, equivalent substitutions, improvements, etc., made within the spirit and principle of the present invention should be included within the scope of the present invention.

What is claimed is:

1. An enhanced device, comprising:
    a substrate;
    a channel layer disposed on the substrate;
    a barrier layer disposed on the channel layer;
    a p-type semiconductor layer disposed on the channel layer;
    and a protective layer disposed on the p-type semiconductor layer, wherein the protective layer is made of AlN or AlGaN; and
    a thin film layer disposed between the barrier layer and the p-type semiconductor layer, wherein the thin film layer is an insulating layer or an n-type semiconductor layer.

2. The enhanced device of claim 1, wherein the p-type semiconductor layer comprises anyone or any combination of p-type GaN, p-type InGaN and p-type AlInGaN.

3. The enhanced device of claim 1, wherein the p-type semiconductor layer is doped with Mg.

4. A method for manufacturing the enhanced device, comprising the following steps:
- forming a channel layer on a substrate;
- forming a barrier layer on the channel layer;
- forming a p-type semiconductor layer on the barrier layer;
- forming a protective layer on the p-type semiconductor layer, wherein the protective layer is made of AlN or AlGaN;
- and annealing the p-type semiconductor layer under protection of the protective layer;
- wherein before the forming a p-type semiconductor layer on the barrier layer, a thin film layer is formed on the barrier layer, wherein the thin film layer is an insulating layer or an n-type semiconductor layer.

5. The method of claims 4, wherein the p-type semiconductor layer comprises anyone or any combination of p-type GaN, p-type InGaN and p-type AlInGaN.

6. The method of claim 4, wherein the p-type semiconductor layer is doped with Mg.

7. The method of claim 4, wherein preparation temperature of the protective layer is not higher than preparation temperature of the p-type semiconductor layer.

* * * * *